United States Patent [19]

Richardson et al.

[11] Patent Number: 4,824,793

[45] Date of Patent: Apr. 25, 1989

[54] METHOD OF MAKING DRAM CELL WITH TRENCH CAPACITOR

[75] Inventors: William F. Richardson, Richardson; Satwinder S. Malhi, Garland, both of Tex.

[73] Assignee: Texas Instruments Incorporated, Dallas, Tex.

[21] Appl. No.: 122,559

[22] Filed: Nov. 12, 1987

Related U.S. Application Data

[60] Continuation of Ser. No. 873,822, Jun. 6, 1986, abandoned, which is a division of Ser. No. 655,849, Sep. 27, 1984, abandoned.

[51] Int. Cl.$^4$ .................. H01L 21/265; H01L 27/10; H01L 21/302
[52] U.S. Cl. ........................... 437/47; 437/38; 437/48; 437/60; 437/203; 437/52; 437/162; 437/249; 437/919
[58] Field of Search .................. 437/203, 47, 60, 919, 437/38, 48, 203, 52, 162, 249; 357/23.6

[56] References Cited

U.S. PATENT DOCUMENTS

| | | | |
|---|---|---|---|
| 3,961,355 | 6/1976 | Abbas et al. | 357/49 |
| 4,003,036 | 1/1977 | Jenne | 340/173 |
| 4,017,885 | 4/1977 | Kendal et al. | 357/24 |
| 4,105,475 | 8/1978 | Jenne | 357/23.6 X |
| 4,115,795 | 9/1978 | Matsuoka et al. | 357/24 |
| 4,116,720 | 9/1978 | Vinson | 357/50 X |
| 4,164,751 | 8/1979 | Tasch, Jr. | 357/41 |
| 4,199,772 | 4/1980 | Natori et al. | 357/23.60 R |
| 4,225,945 | 9/1980 | Kuo | 365/149 |
| 4,262,296 | 4/1981 | Shealy et al. | 357/55 |
| 4,319,342 | 3/1982 | Scheuerlein | 365/149 |
| 4,327,476 | 5/1982 | Iwai et al. | 437/38 |
| 4,353,086 | 10/1982 | Jaccodine et al. | 29/580 |
| 4,364,074 | 12/1982 | Garnache et al. | 148/188 |
| 4,369,564 | 1/1983 | Hiltpold | 437/38 |
| 4,397,075 | 8/1983 | Fatula, Jr. et al. | 437/203 |
| 4,412,237 | 10/1983 | Matsummura | 357/42 |
| 4,432,006 | 2/1984 | Takei | 357/23 |
| 4,434,433 | 2/1984 | Nishizawa | 357/22 |
| 4,462,040 | 7/1984 | Ho et al. | 357/23.60 R |
| 4,472,240 | 9/1984 | Kameyama | 156/648 |
| 4,476,623 | 10/1984 | El-Kareh | 437/52 |
| 4,536,785 | 8/1985 | Gibbons | 357/54 |
| 4,568,958 | 2/1986 | Baliga | 357/23.4 |
| 4,630,088 | 12/1986 | Ogura et al. | 357/23.6 |
| 4,636,281 | 1/1987 | Buiguez et al. | 156/643 |
| 4,649,625 | 3/1987 | Lu | 437/60 |
| 4,650,544 | 3/1987 | Erb et al. | 156/653 |
| 4,651,184 | 3/1987 | Malhi | 357/23.6 |
| 4,670,768 | 6/1987 | Sunami et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,702,795 | 10/1987 | Douglas | 156/643 |
| 4,704,368 | 11/1987 | Goth et al. | 437/60 |
| 4,717,942 | 1/1988 | Nakamura et al. | 357/23.6 |
| 4,751,557 | 1/1988 | Sunami et al. | 357/23.6 |
| 4,751,558 | 6/1988 | Kenney | 357/23.6 |

FOREIGN PATENT DOCUMENTS 0066081 12/1982 European Pat. Off. .

(List continued on next page.)

OTHER PUBLICATIONS

Chang, T. S. and Critchlow, D. L., "Vertical FET Random-Access Memories with Deep Trench Isolation", *IBM Technical Disclosure Bulletin*, vol. 22, No. 8B, Jan. 1980, pp. 3683-3687.

(List continued on next page.)

Primary Examiner—Brian E. Hearn
Assistant Examiner—Tom Thomas
Attorney, Agent, or Firm—Thomas W. DeMond; James T. Comfort; Melvin Sharp

[57] ABSTRACT

A dRAM cell and array of cells, together with a method of fabrication, are disclosed wherein the cell includes one field effect transistor and one storage capacitor with both the transistor and the capacitor formed in a trench in a substrate. The transistor source, channel, and drain and one capacitor plate are formed essentially vertically in the sidewalls of the trench, and the gate and other capacitor plate are formed in two regions of material inserted into the trench. Signal charge is stored on the material inserted into the trench. In preferred embodiments word lines on the substrate surface connect to the upper of the inserted regions which forms the gate, and bit lines on the substrate surface are formed as diffusions in the substrate which also form the drains. The trenches and cells are formed at the crossings of bit lines and word lines; the bit lines and the word lines form perpendicular sets of parallel lines.

46 Claims, 4 Drawing Sheets

FOREIGN PATENT DOCUMENTS

| | | |
|---|---|---|
| 0008845 | 9/1983 | European Pat. Off. . |
| 0108390 | 5/1984 | European Pat. Off. . |
| 167764 | 1/1986 | European Pat. Off. . |
| 176254 | 4/1986 | European Pat. Off. . |
| 186875 | 7/1986 | European Pat. Off. . |
| 2706155 | 8/1978 | Fed. Rep. of Germany . |
| 3508996 | 10/1985 | Fed. Rep. of Germany . |
| 3525418 | 1/1986 | Fed. Rep. of Germany ..... 357/23.6 |
| 130178 | 12/1976 | Japan . |
| 0010973 | 1/1982 | Japan . |
| 109367 | 7/1982 | Japan . |
| 0003269 | 1/1983 | Japan ................. 357/23.6 |
| 0010861 | 1/1983 | Japan . |
| 141262 | 2/1983 | Japan . |
| 0204568 | 11/1983 | Japan . |
| 213464 | 12/1983 | Japan . |
| 0019366 | 1/1984 | Japan . |
| 0103373 | 1/1984 | Japan . |
| 0012752 | 1/1985 | Japan . |
| 0182161 | 9/1985 | Japan . |
| 261165 | 12/1985 | Japan . |
| 36965 | 2/1986 | Japan . |
| 73366 | 4/1986 | Japan . |
| 198590 | 11/1986 | Japan . |
| 1084937 | 9/1967 | United Kingdom . |
| 2002958 | 2/1979 | United Kingdom . |
| 2168195 | 12/1985 | United Kingdom . |

OTHER PUBLICATIONS

Kenney, D. M., "Reduced Bit Line Capacitance in VMOS Devices", *IBM Technical Disclosure Bulletin*, vol. 23, No. 9, Feb. 1981, pp. 4052–4053.

Lee, H. S. and Troutman, R. R., "Short-Channel Field-Effect Transistors in V-Grooves", *IBM Technical Disclosure Bulletin*, vol. 22, No. 8B, Jan. 1980, pp. 3630–3634.

Chang, "Vertical FET–Random-Access Memories with Deep Trench Isolation", IBM TDB, vol. 22, No. 8B, Jan. 1980, pp. 3683–3687.

Lee et al., IBM TDB, vol. 22, No. 8B, Jan. 80, pp. 3630–3634.

Fatula et al., IBM TDB, vol. 22, No. 8A, Jan. 1980, pp. 3204–3205.

Chang et al., IBM TDB, vol. 22, No. 7, Dec. 79, pp. 2768–2771.

Kenney, IBM TDB, vol. 23, No. 3, Aug. 80, pp. 967–969.

Barson, IBM TDB, vol. 21, No. 7, Dec. 78, pp. 2755–2756.

Jamboticar, "Compact One-Device Dynamic RAM Cell with High Storage Capacitance," IBM TDB, Jul. 1984, pp. 1313–1320.

Clarice et al., IBM TDB, vol. 17, No. 19, Feb. 1975, pp. 2579–2580.

Chang et al., IBM TDB, vol. 22, No. 8B, Jan. 1980, pp. 3683–3687.

Kenney, IBM TDB, vol. 23, No. 9, Feb. 81, pp. 4052–4053.

METHOD OF MAKING DRAM CELL WITH TRENCH CAPACITOR

This application is a continuation of application Ser. No. 873,822, filed on June 6, 1986, which is a division of Ser. No. 655,849, filed on Sept. 27, 1984, now abandoned.

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a five volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since electrodes both above and below are separated from the storage region in the recrystallized polysilicon by thin oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor.

A second approach to shrinking dRAM cell size relies on a capacitor with plates extending into the substrate. This capacitor, called a corrugated capacitor, is described in H. Sunami et at, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec.Dev.Lett. 90 (1983); and K. Itoh et al, An Experimental 1 Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor cell, IEEE IEDM Tech Digest 319 (1983); and T. Morie et al, Depletion Trench Capacitor Technology for Megabit Level MOS dRAM, 4 IEEE Elec.Dev.Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4-5 ohm-cm resistivity silicon substrates, trench patterns with 0.4-1.0 micron width were formed by electron-beam direct writing. Trenches of 1-3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorous diffused into the trench surface layers, and the PSG etched away by hydofluoric acid. $SiO_2$ of 150-500 A was grown in dry $O_2$ or CVD $Si_3N_4$ was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area.

The use of trenches for isolation is also well known and has been extensively studied; for example, R. Rung et al, Deep Trench Isolated CMOS Device, IEEE IEDM Tech Digest 237 (1982); K. Cham et al, A Study of the Trench Inversion Problem in the Trench CMOS Technology, 4 IEEE Elec.Dev.Lett. 303 (1983); A. Hayasaka et al, U-Groove Isolation Technique for High Speed Bipolar VLSI's, IEEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-um-Channel CMOS Using Self-Aligned TiSi$_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with CBrF$_3$, CCl$_4$, Cl$_2$—H$_2$, CCl$_4$—O$_2$, etc. excavation, thermal oxidation (plus LPCVD nitride) of the sidewalls, and filling with polysilicon.

However, the use of trench capacitors fails to fully solve the problems of shrinking dRAM cell size; namely, the cell still occupies a large substrate area for both the horizontally placed field effect transistor and a nearby vertically placed trench capacitor.

SUMMARY OF THE INVENTION

The present invention provides a one-transistor dRAM cell structure and array in which the cell transistor is formed on the sidewalls of a substrate trench containing the cell capacitor; the word and bit lines cross over this trench. This yields a stacking of the transistor on top of the capacitor and a minimal cell area on the substrate to solve the problem of dense packing of cells.

In a preferred embodiment, one capacitor plate and the transistor channel are formed in the bulk sidewall of the trench and the transistor gate and the other plate of the capacitor are both formed of polysilicon in the trench but separated by an oxide layer inside the trench. The signal charge is stored on the polysilicon capacitor plate.

DESCRIPTION OF THE PREFERRED EMBODIMENTS

Figure 1A:
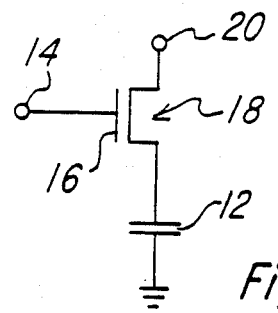
FIGS. 1A-B are the schematic equivalent circuit and local memory array geometry for preferred embodiment dRAM cells.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write. Leakage currents and other sources of decay of the charge on capacitor 12 necessitate periodic refreshing of the charge, and thus the name dynamic RAM (dRAM).

Figure 1B:
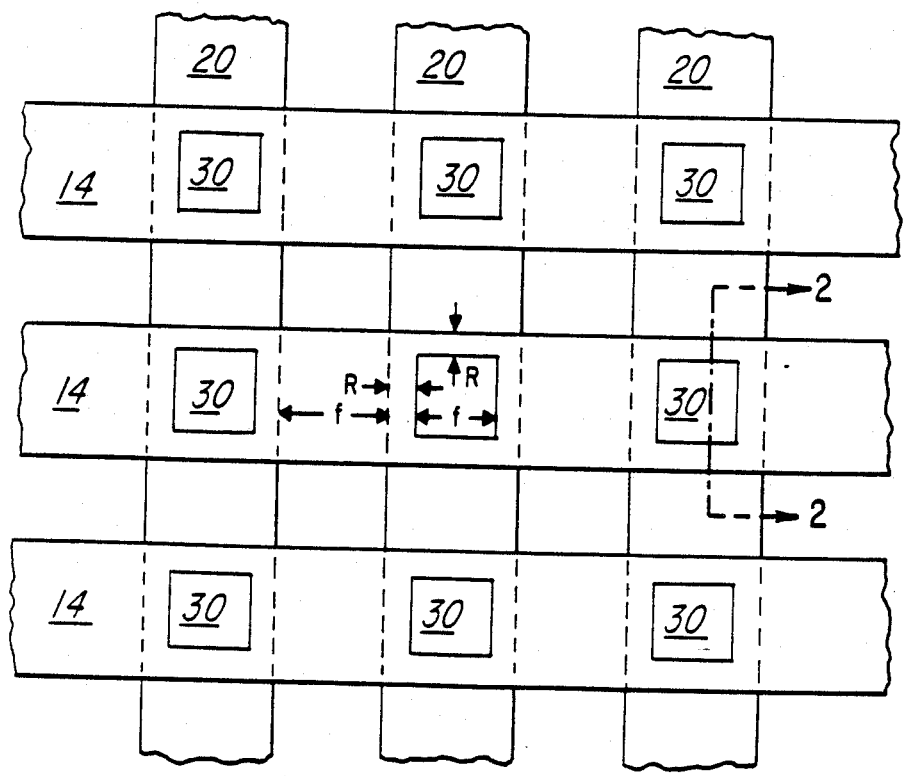

FIG. 1B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is $[2(f+R)]^2$. For example, with a minimum feature size of 1.0 micron and a minimum registration tolerance of 0.25 micron, the cell area is about 6.25 square microns.

Figure 2:
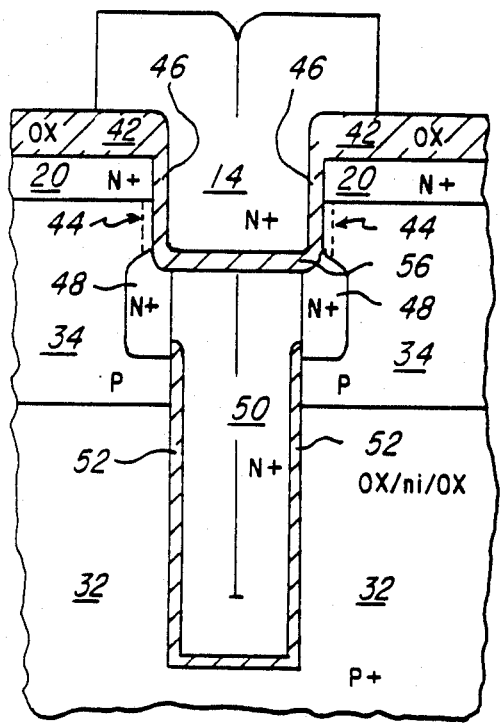
FIG. 2 is a schematic cross sectional elevation of a first preferred embodiment dRAM cell taken along line 2—2 of FIG. 1B.

FIG. 2 is a cross sectional view of the first preferred embodiment dRAM cell, generally denoted 30. Cell 30 is formed in p+ silicon substrate 32 with p epilayer 34 and includes n+ buried bit line 20, bit line insulator oxide 42, n+ polysilicon word line 14, transistor 18 channel 44, transistor 18 gate oxide 46, n+ diffused region 48 which forms the source region for transistor 18, n+ polysilicon region 50 which forms one of the plates of capacitor 12 with p+ substrate 32 forming the other and ground plate, oxide/nitride/oxide stack 52 which forms the insulator between the plates of capacitor 12, and insulating oxide 56. The view of cell 30 in FIG. 2 corresponds to a section along horizontal line 2—2 in FIG. 1B; the square cross section of the trench containing capacitor 12 and transistor 18 is apparent in FIG. 1B.

In cell 30 capacitor 12 is formed with one of its plates being n+ regions 48 and 50 and the other plate being substrate 32 plus epilayer 34; however, the doping of epilayer 34 is much lower than that of p+ substrate 32, so the capacitance of the n+/p junction of region 48 and epilayer 34 and the capacitance of n+ region 50/stack 52/p epilayer 34 are both much less than the capacitance of n+ region 50/stack 52/p+ substrate 32 and may be ignored. Also, as will be detailed below, the plate area of epilayer 34 is small compared to that of substrate 32, and this further implies the insignificance of the epilayer 34 capacitance. For a trench with a 1 micron by 1 micron cross section and 5 microns deep, the capacitor 12 plate area would be about 17 square microns if 1 micron of the depth is epilayer 34 and bit line 20. P+ substrate 32 is the ground common to all cells 30 in an array.

Transistor 18 in cell 30 is entirely in bulk silicon with a polysilicon gate: channel region 44 is part of p epilayer 34, source region 48 (which is also a part of a plate of capacitor 12) and drain region 20 (which is also bit line 20) are n+ diffusions in p epilayer 34, gate oxide 46 is grown on the trench surface of p epilayer 34, and the gate is part of polysilicon word line 14. Insulating oxide 42 is fairly thick, but gate 14 still overlaps the source and drain of transistor 18.

The dimensions and materials characteristics of cell 30 are best understood in connection with the following description of a first preferred embodiment method of fabricating cell 30; FIGS. 3A-G illustrate the sequence of process steps.

Figure 3A:
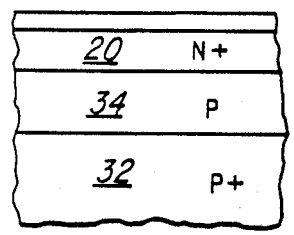
FIGS. 3A-G illustrate a sequence of process steps for fabrication of the first preferred embodiment cell by a first preferred embodiment method.
Figure 3B:
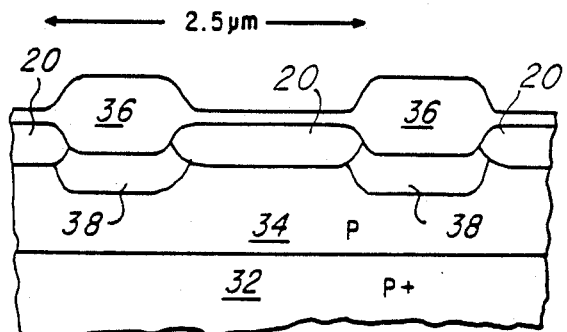
Figure 3C:
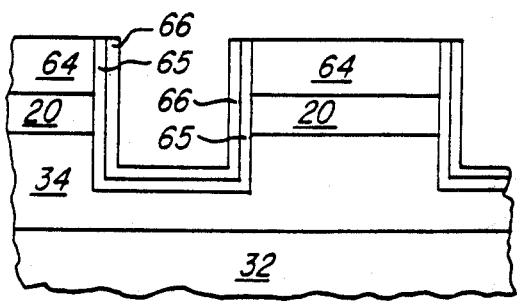
Figure 3D:
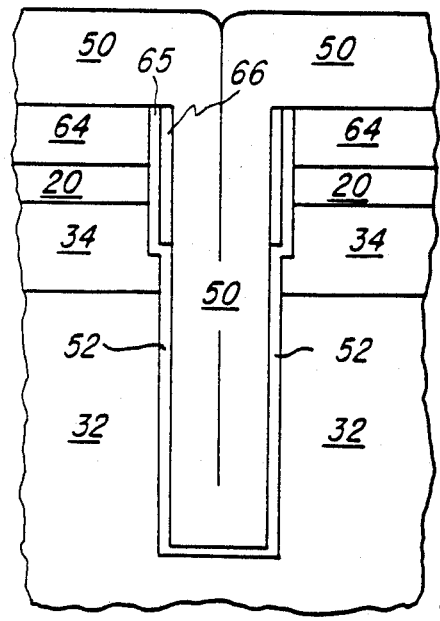
Figure 3E:
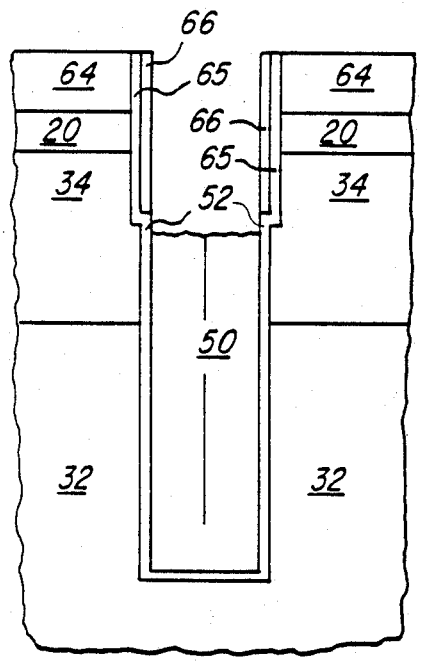
Figure 3F:
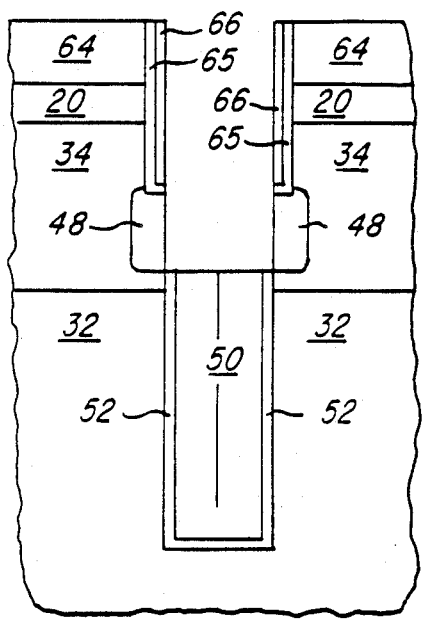
Figure 3G:
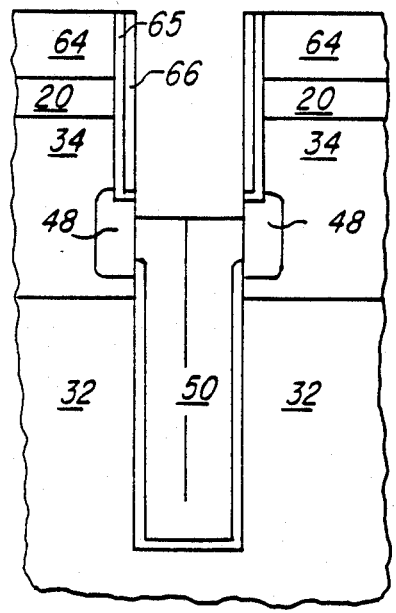

1. (100) oriented p+ silicon substrate 32 of resistivity less than 1E-2 ohm-cm has p epilayer 34 grown with a carrier concentration of 2E16 per cm$^3$ and the thickness such that after all thermal processing the final p epilayer thickness is 2.0 microns. Field oxide 36 and p channel stops 38 are formed in the usual manner: a stress relief oxide layer is grown and LPCVD nitride is deposited on the oxide; the active area (bit lines 20 plus peripheral area outside of the cell array) is patterned and plasma etching removes the nitride and oxide outside the active area; a boron implant using the nitride as a mask creates channel stops 38 to a depth of 4,000 A with a carrier concentration of 1E17 per cm$^3$; and field oxide 36 is grown to a thickness of 8,000 A. The nitride is stripped; photolithography defines the portion of the active area to be occupied by bit lines 20, and an arsenic implant forms them to a depth of 2,000 A with a carrier concentration of 1E20 per cm$^3$; see FIGS. 3A–B for the view after photoresist cleanup and protective oxide growth. FIG. 3A is a cross section along bit lines 20 and FIG. 3B is a cross section perpendicular to bit lines 20; note that bit lines 20 are about 1.5 microns wide as described in connection with FIG. 1B.

2. One micron of plasma enhanced CVD oxide 64 is deposited and patterned to define the 1 micron square trenches. The patterned oxide 64 is then used as the mask for RIE with HCl excavation of the trenches to a depth of 1.25 microns. The trench walls are cleaned of RIE damage and contamination with a wet acid etch, and protective oxide 65 thermally grown on the trench walls and bottom; an LPCVD deposition of nitride 66 in a sidewall process is used to protect the sidewall oxide and limit diffusion in subsequent processing; oxide 65 may be about 200 A thick and nitride 66 may be about 1,000 A thick. See FIG. 3C which is the cross section along bit lines 20 as are FIGS. 3D–H.

3. The trench is further excavated again using RIE with HCl, note that oxide 64 is also being somewhat eroded, but was initially deposited sufficiently thick to avoid problems. After the trench has been excavated to a total depth of about 5.0 microns, it is cleaned and capacitor 12 insulator stack 52 is formed by thermally growing oxide to a thickness of 100 A followed by a LPCVD deposition of nitride to a thickness of 75 A. The nitride is then thermally oxidized to improve the dielectric integrity and this yields the oxide/nitride/oxide stack 52. The trench is filled with n+ doped polysilicon 50; see FIG. 3D.

4. Polysilicon 50 is planarized, such as with spun on photoresist, and plasma etched completely away on the surface and down into the trench to 3,000 A below the upper level of insulator stack 52 but above substrate 32. As will be seen below, the location of the top of polysilicon 50 is not crucial provided that it lies somewhat below the top of stack 52 and above substrate 32. See FIG. 3E.

5. The exposed portion of stack 52 is stripped (recall nitride 66 is much thicker than stack 52, so the exposed portion of stack 52 may be stripped without removing much of nitride 66), and a phosphorous vapor phase diffusion used to form n+ regions 48 with a thickness of at least 2,000 A; see FIG. 3F. Note that in FIG. 3F there appear to be two regions 48, but actually they are just part of a single annular region that girdles the trench and forms the source for transistor 18. The gate oxide for transistor 18 has not yet been formed.

6. N+ polysilicon is deposited by LPCVD and planarized and plasma etched completely away on the surface and down into the trench to just below the oxide 65 and nitride 66. Note that this polysilicon just adds to polysilicon 50 and is denoted by the same reference number; see FIG. 3G. Note that again the location of the top of polysilicon 50 is not crucial provided that sufficient overlap of polysilicon 50 with region 48 exists for good electrical contact and that all of oxide 65 and nitride 66 are exposed which will insure that the gate of transistor 18 covers all of the channel, as described below.

7. Thermal oxide 56 is grown on the exposed portions of polysilicon 50 and regions 48 to a thickness of about 1,000 A; nitride 66 prevents oxide 65 from growing except for a bird's beak at the lower edge. Oxide 56 is grown to help lower the gate to source parasitic capacitance of transistor 18 and could be omitted. Next nitride 66 is etched and then oxide 65 (and a portion of the much thicker oxide 56) is wet etched away, exposing channel region 44 and a small part of region 48. Gate oxide 46 is grown on channel region 44 to a thickness of 250 A (this also increases the thickness of oxide 56) and n+ polysilicon 14 is deposited and patterned to form work lines 14. See FIG. 2 for the completed cell.

Second preferred embodiment dRAM cell, generally denoted 130, and second preferred method of fabrication are illustrated in FIGS. 4A–D in cross sectional elevation views analogous to those of FIGS. 2 and 3A–G. The processing steps are as follows.

1. (100) oriented p+ silicon substrate 132 has 1,000 A of thermal oxide 135 grown and 1 micron of plasma enhanced CVD oxide 137 deposited. Oxide 137 is patterned to define the 1 micron square trenches and then used as the mask for RIE with HCl excavation of the trenches to a depth of 5 microns. The trench walls are cleaned and capacitor oxide 152 thermally grown on the trench sidewalls and bottom to a thickness of 150 A. Next, 4 microns of arsenic doped n+ polysilicon 150 is sputter deposited; see FIG. 4A.

2. The oxides are wet etched, this removes the exposed portion of capacitor oxide 152 and lifts off the portion of polysilicon 150 on oxide 137. 2,000 A thick layer of 1–2 ohm-cm silicon epilayer 144 is deposited and implanted to form layer 120 which will become n+ bit lines 20 and the drain of transistor 18 plus region 148 which will become the source of transistor 18; see FIG. 4B. Of course, region 148 is expected to have various faults since it is deposited over polysilicon 150, but this is not significant because the undoped portion of epilayer 144 will become the channel of transistor 18.

3. An anneal causes the implanted donors to diffuse and thereby make region 148 bulge slightly. Gate oxide 146 is thermally grown to a thickness of 250 A, and n+ polysilicon 14 is deposited and patterned and etched to form word lines 14. See FIG. 4C for the completed cell.

A third preferred embodiment cell, generally denoted 160, is a variation of cell 130 and fabricated by a third preferred embodiment method which is a variation of the second preferred method, as follows, with the same reference numbers used for corresponding features:

1. Follow step 1 and the oxide etch of step 2.

Figure 4A:
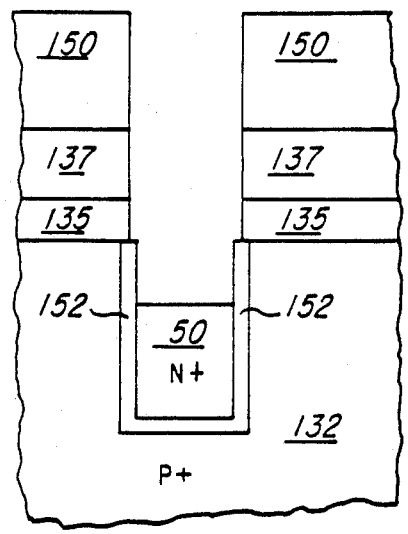
FIGS. 4A-E illustrate second and third preferred embodiment cells and second and third preferred embodiment methods of fabrication.
Figure 4B:
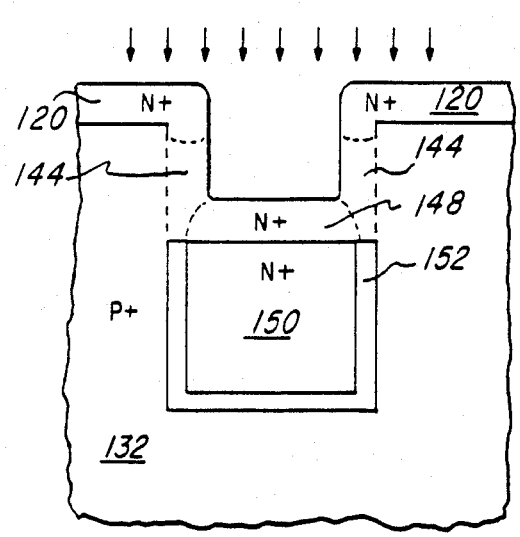
Figure 4C:
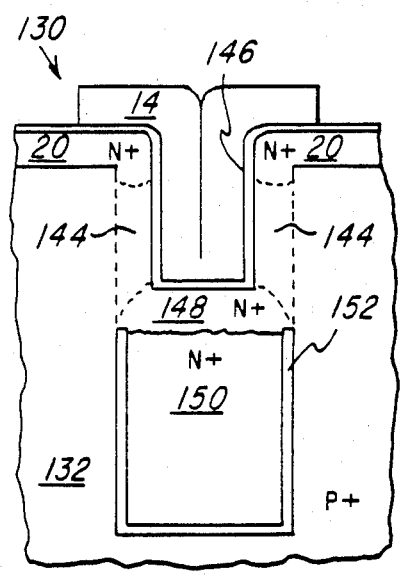

2. 2,000 A thick layer of LPCVD polysilicon 144 is deposited and implanted to form layers n+ layers 120 and 148; FIG. 4B describes this provided it is understood that regions 120, 144, and 148 are polysilicon and not epilayer as with the second preferred embodiment.

Figure 4D:
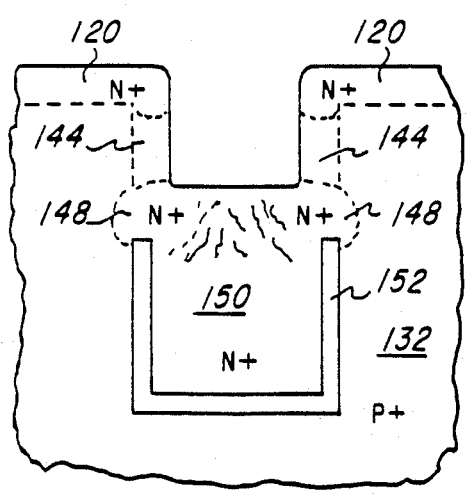

3. Annealing and solid phase epitaxy convert regions 120 and 144 into epilayers on substrate 132. And, a portion of regions 148 and 150 is also converted to single crystal; the wavy lines in FIG. 4D suggest this partial crystallization. Note that only the crystallization of region 144 (the channel of transistor 18) significantly affects performance. The high temperatures used in this processing causes some of the donor implants to diffuse, and thus regions 148 bulge out, as shown in FIG. 4D. Layer 120 is patterned and etched to form bit lines 20.

Figure 4E:
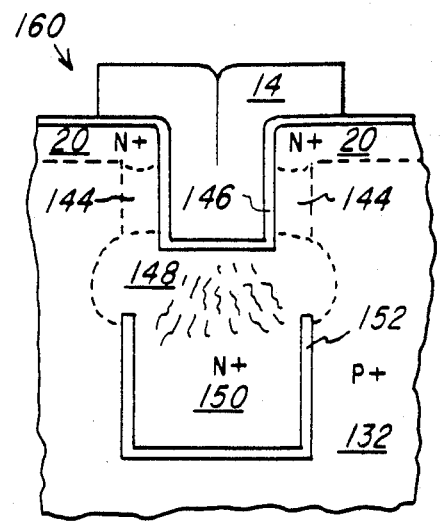

4. Gate oxide 146 is thermally grown to a thickness of 250 Å, and n+ polysilicon 14 is deposited and patterned and etched to form word lines 14. See FIG. 4E for the completed cell 160.

Cells 130 and 160 operate in the same manner as cell 30: transistor 18 is oriented vertically with drain 20, channel 144, source 148, and gate 14; and capacitor 12 has n+ region 148-150 as one plate, p+ substrate 132 as the other plate, and oxide layer 152 plus the reversed biased junction between region 148 and substrate 132 as the dielectric.

A variation in step 3 of the fabrication of cell 160 patterns and etches layer 120 after the solid phase epitaxy to define and implant the channel stops between the bit lines 20; see FIG. 3B for the fabrication of channel stops 38 between bit lines 20 in the first preferred embodiment method of fabrication.

Modifications of the preferred embodiment cells or preferred embodiment methods of fabrication such as varying the dimensions, the shape of the trenches, doping levels, substitutional materials, diffusions in lieu of implantations, wet instead of dry etching, various halocarbons for RIE, omitting protective nitride 66, and so forth are immediate.

I claim:

1. A method for forming a coupled capacitor and transistor comprising the steps of:
   forming a trench in the surface of a substrate;
   coating the surfaces of said trench with a first insulating layer;
   forming a first conductive region by filling the remainder of said trench with a conductive material;
   etching back said insulating layer and said conductor material to a level within said trench;
   forming a second conductive region by depositing conductive material in the portion of said trench opened by a said etching step;
   etching back said second conductive region to a level within said trench but above said insulating layer;
   forming a source region in said substrate, said source region electrically connected to said second conductive region;
   forming a second insulating layer on the exposed surfaces of said trench and on the exposed surface of said second conductive material;
   forming drain regions adjacent to the intersection between said trench and the surface of said substrate;
   forming a third conductive region by filling the remaining portion of said trench with a conductive material, said third conductive region serving as a gate controlling current between said source and said drain.

2. A method according to claim 1 wherein said substrate comprises silicon.

3. A method according to claim 1 wherein said first insulating layer comprises silicon dioxide.

4. A method according to claim 1 wherein said second insulating layer comprises silicon dioxide.

5. A method according to claim 1 wherein said first conductive region comprises silicon.

6. A method according to claim 1 wherein said second conductive region comprises silicon.

7. A method according to claim 1 wherein said third conductive region comprises silicon.

8. A method according to claim 1 wherein said source region is formed by diffusing dopant atoms from said second conductive region into said substrate.

9. A method of forming a contact on a wall extending into a substrate substantially perpendicular to the surface of said substrate comprising the steps of:
   (a) forming an insulating layer on said wall;
   (b) forming a conductor including part of a device along at least a portion of said wall;
   (c) removing said conductor from along a part of said wall;
   (d) removing a portion of said insulating layer; and
   (e) forming a contact to said wall within at least a part of said portion of said insulating layer utilizing a conductive material in contact with said conductor.

10. Method as in claim 9 wherein said wall is perpendicular to the surface of said substrate.

11. Method as in claim 9 wherein said insulating layer includes an oxide and a nitride.

12. Device as in claim 9 wherein said wall is one wall of a trench.

13. Method as in claim 9 wherein step (e) includes forming polycrystalline silicon.

14. Method as in claim 9 wherein step (e) includes forming monocrystalline silicon.

15. Method as in claim 9 wherein said device includes a part of a capacitor.

16. Method as in claim 9 including the step of forming a transistor with the channel of said transistor along a section said wall.

17. Method as in claim 9 wherein step (e) includes forming polycrystalline material.

18. Method as in claim 9 wherein step (e) includes forming monocrystalline material.

19. Method as in claim 9 wherein step (e) includes forming epitaxial material.

20. A method of forming a contact on a wall extending into a substrate at an angle to the surface of said substrate comprising the steps of:
   (a) forming an insulating layer on said wall;
   (b) forming a conductor including part of a device along at least a portion of said wall;
   (c) removing said conductor from along a part of said wall;
   (d) removing a portion of said insulating layer; and
   (e) forming a contact to said wall within at least a part of said portion of said insulating layer utilizing a conductive material in contact with said conductor.

21. Method as in claim 20 wherein the angle makes said wall substantially perpendicular to said surface.

22. Method as in claim 20 wherein the angle makes said wall perpendicular to said surface.

23. Method as in claim 20 wherein said insulating layer includes an oxide.

24. Method as in claim 20 wherein said insulating layer includes a nitride.

25. Method as in claim 20 wherein said insulating layer includes an oxide and a nitride.

26. Device as in claim 20 wherein said wall forms a part of a trench.

27. Device as in claim 20 wherein said wall is one wall of a trench.

28. Method as in claim 20 wherein said conductor is polysilicon.

29. Method as in claim 20 wherein step (e) includes forming polycrystalline silicon.

30. Method as in claim 20 wherein step (e) includes forming monocrystalline silicon.

31. Method as in claim 20 wherein said portion of said insulating layer is within at least some of said part of said wall.

32. Method as in claim 20 wherein said conductive material is polycrystalline silicon.

33. Method as in claim 20 wherein said conductive material is monocrystalline silicon.

34. Method as in claim 20 wherein said substrate includes a layer of epitaxial material and said wall extends through at least part of said layer of epitaxial material.

35. Method as in claim 20 wherein step (e) includes forming polycrystalline material.

36. Method as in claim 20 wherein step (e) includes forming monocrystalline material.

37. Method as in claim 20 wherein step (e) includes forming epitaxial material.

38. Method as in claim 20 wherein step (e) includes forming a layer of said conductive material.

39. Method as in claim 20 wherein step (e) includes forming a layer of said material and doping at least part of said layer to form said conductive material.

40. Method as in claim 20 wherein step (e) includes forming a doped layer of material to form said conductive material.

41. Method as in claim 20 wherein step (e) includes forming a doped region in an area of said wall.

42. Method as in claim 20 wherein said contact is to a doped region in said wall.

43. Method as in claim 20 wherein said device includes a part of a capacitor.

44. Method as in claim 20 wherein said conductor forms one plate of a capacitor.

45. Method as in claim 20 wherein said conductor forms one plate of a capacitor and at least a part of said wall forms another plate of said capacitor.

46. Method as in claim 20 including the step of forming a transistor with the channel of said transistor along a section said wall.

* * * * *